United States Patent [19]
Johnson et al.

[11] Patent Number: 5,509,031
[45] Date of Patent: Apr. 16, 1996

[54] METHOD OF TRANSMITTING AND RECEIVING ENCODED DATA IN A RADIO COMMUNICATION SYSTEM

[76] Inventors: Chris Johnson, 959 W. Webster. 5A, Chicago, Ill. 60614; Scott E. Zielke, 245 Park Ln. #116, Palatine, Ill. 60067

[21] Appl. No.: 456,014

[22] Filed: May 31, 1995

Related U.S. Application Data

[63] Continuation of Ser. No. 85,529, Jun. 30, 1993, abandoned.

[51] Int. Cl.⁶ .................................................. H04L 5/12
[52] U.S. Cl. .................... 375/262; 375/265; 375/285; 375/296; 375/340; 375/341; 370/76; 370/110.4; 370/118; 379/93; 379/97
[58] Field of Search ..................................... 375/254, 259, 375/261, 262, 265, 285, 296, 340, 341, 240, 377; 370/76, 85.6, 110.1, 110.4, 118; 379/93, 97, 98

[56] References Cited

U.S. PATENT DOCUMENTS

| | | | |
|---|---|---|---|
| 4,495,620 | 1/1985 | Stelle et al. | 370/110.4 |
| 5,159,608 | 10/1992 | Falconer et al. | 375/1 |
| 5,193,102 | 3/1993 | Meidan et al. | 375/1 |
| 5,263,051 | 11/1993 | Eyuboglu | 375/58 |
| 5,278,866 | 1/1994 | Nonami | 375/10 |
| 5,282,197 | 1/1994 | Kreitzer | 370/76 |
| 5,289,504 | 2/1994 | Wilson et al. | 375/75 |

*Primary Examiner*—Stephen Chin
*Assistant Examiner*—Amanda T. Le
*Attorney, Agent, or Firm*—James A. Coffing

[57] ABSTRACT

In a radio communication system, a method of transmitting encoded data includes providing a plurality of discrete data elements to be presently transmitted. These data elements are then encoded using a first encoding technique. An indication is then provided when at least some of the encoded discrete data elements have been compromised. At the receiver, it is determined whether at least some of the received, encoded, discrete data elements have been compromised. A decision metric is then provided based on this determination, and the data elements are decoded using the decision metric.

7 Claims, 3 Drawing Sheets

METHOD OF TRANSMITTING AND RECEIVING ENCODED DATA IN A RADIO COMMUNICATION SYSTEM

This is a continuation of application Ser. No. 08/085,529, filed Jun. 30, 1993 and now abandoned.

FIELD OF THE INVENTION

The present invention relates generally to radio communication systems, and more particularly to such communication systems that transmit control information interposed among digitally encoded voice information.

BACKGROUND OF THE INVENTION

Radio communication systems are well known in the art. Pursuant to many such systems, an information signal—which may describe a plurality of discrete data elements—is modulated onto a carrier signal and transmitted from a first location to a second location. At the second location, the information signal is demodulated and recovered. Of course, one of the goals of such communication systems is to place a high number of voice channels within a given radio frequency (RF) channel bandwidth while maintaining acceptable recovery levels.

In a digital radio communication system, an input speech wave form is sampled, compressed, encoded, and transmitted through a digital radio communication channel. Prior to transmission, the compressed data elements might be grouped together in a predetermined fashion to form a data transmission unit (TU). For example, digital information can be compressed using vector sum excited linear prediction (VSELP), a well known technique in the digital communication area. FIG. 1 shows a portion of a digital data stream (100), including a VSELP TU (102). The VSELP TU (102) typically carries digital data that is divided into three groups (104–106). The data in the VSELP TU (102) might be divided into groups based on their relative importance to the resultant speech quality. That is, group I data bits might contribute significantly to the overall quality of the decompressed signal, while group 3 data bits may have very little effect on the resultant speech quality. In addition to the data bits shown in data stream (100), control information is also transmitted to the receiver.

Once the data is divided up into groups, the bits may be encoded (e.g., using well known trellis techniques) before being modulated. In particular, data partitioning allows for trellis coding of the data groups at different coding rates. That is, depending on the sensitivity to bit errors (i.e., individual contribution to overall speech quality), an optimal trellis coding rate may be applied to each of the different groups within the same VSELP TU.

Generally, the control information that is transmitted along with the voice information resides in a particular portion of the data stream. However, in some digital radio communication system embodiments, additional control information occasionally replaces a portion of the data stream just prior to being modulated. That is, at some point during the encoding process, the transmitter might need to send additional control information to the receiver (e.g., control information concerning the status or maintenance of a call). Accordingly, this control information is arbitrarily added to the data stream.

To illustrate, FIG. 2. shows an encoded TU (200) after control information (201) is added on top of the normal encoded data packets (e.g., as shown in FIG. 1). This process, commonly referred to as bit stealing, completely compromises the integrity of the data which previously occupied the position that is now occupied by the control information (201) in the encoded TU. That is, because the data information has been overwritten, there is no way to recover that information at the receiving end.

Accordingly, there exists a need for a digital radio communication system that reduces the negative impact that normally results when control information overwrites data information. A system that would allow the voice information to be compromised while reducing the associated degradation in received signal quality and preserving spectral efficiency, would be an improvement over the prior art.

DETAILED DESCRIPTION OF A PREFERRED EMBODIMENT

The present invention encompasses a method by which a compromised data stream (i.e., one whose elements have been overwritten with control information) can be effectively decoded without undesirable signal degradation. In particular, the transmitting end is equipped with a means for detecting whether or not the data stream has been compromised. Upon detection of such a condition, an indicia is sent along with the compromised data stream to convey to the receiver that some of the information contained therein contains special handling. The receiving end, upon detection of the transmitted indicia, or flag, forces the decoder input to a small value. That is, the decoder parameters are set as though the channel conditions are very poor. In this manner, the decoder relies on upstream and downstream encoded data elements to decode the information that has been compromised.

Figure 1:
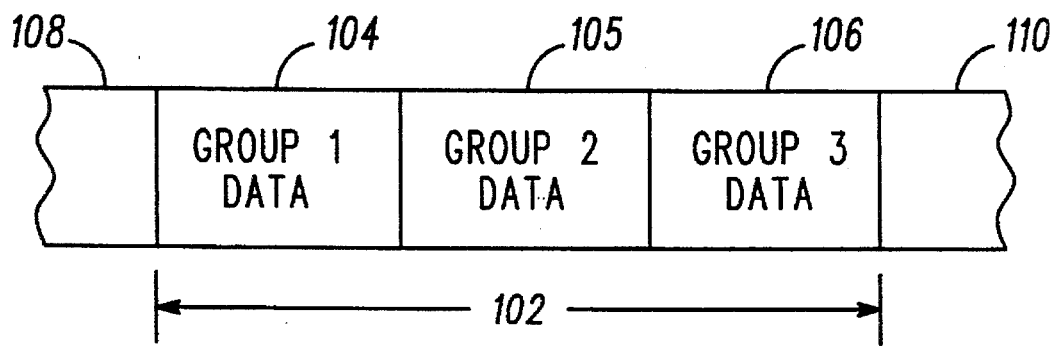
FIG. 1 shows a portion of a radio communication data stream, as is well known in the art.
Figure 2:
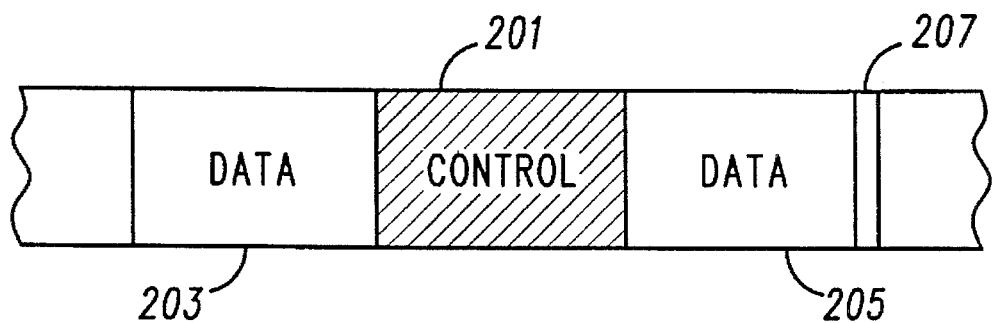
FIG. 2 shows a segment of an encoded data stream, after being altered in accordance with the present invention.

Referring again to FIG. 2, a preferred embodiment of the data stream (200) includes 15 milliseconds of digital information representing 90 milliseconds of raw speech information. In particular, the data elements have been VSELP compressed and trellis coded into approximately 43 symbols of digital information, seven of which might include normal slot control information. When the system requires additional control information to be sent, that information is overwritten into the encoded data stream, in a predetermined position (201), and transmitted along with the speech information. If this occurs, the steal flag bit (207) is set, thereby providing an indication to the receiver that the data elements have been compromised.

Figure 3:
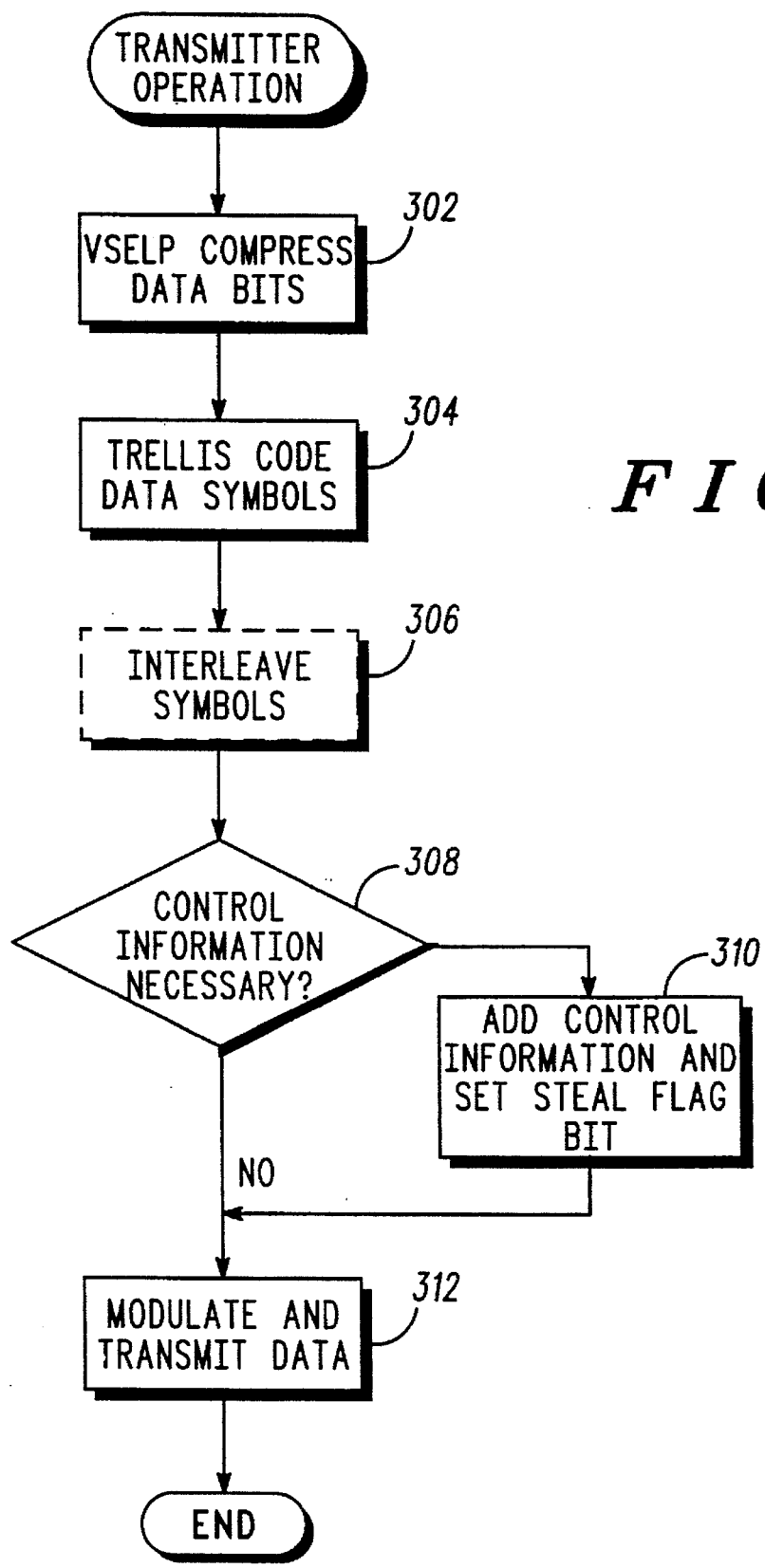
FIG. 3 shows a data flow diagram depicting the transmitter operation, in accordance with the present invention.

FIG. 3 shows a data flow diagram depicting the operation of the transmitter, in accordance with the present invention. In a preferred embodiment of the invention, the digital voice bits are compressed (302) into VSELP bits. Error correction is then performed on the VSELP bits, which error correction is preferably trellis coding, thereby resulting in trellis coded (304) data symbols. The data symbols are then optionally interleaved (306). In a preferred embodiment, interleaving is performed prior to the point in which control information is overwritten onto the data stream. A decision is then reached (308), where it is determined whether or not additional control information is required. If so, the control information is added, and the steal flag bit (207 shown in FIG. 2) is set to a predetermined value. The data is then modulated, preferably using a 16-QAM modulation scheme, and then transmitted (312) over the air, using well known transmission techniques.

Figure 4:
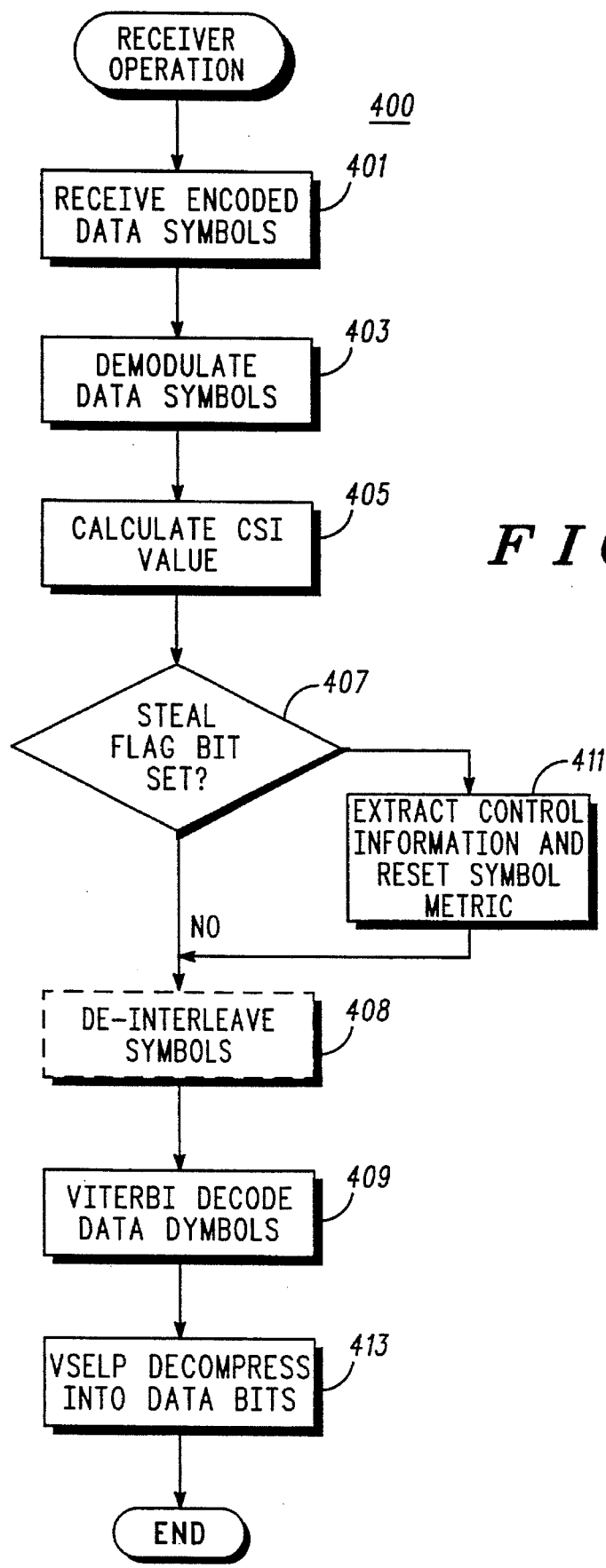
FIG. 4 shows a data flow diagram depicting the receiver operation, in accordance with the present invention.

FIG. 4 shows a data flow diagram (400) depicting the operation of the receiver, in accordance with the present invention. The encoded data symbols are received (401) and demodulated (403), and channel state information (CSI) is calculated (405), as later described. The CSI value represents a metric corresponding to a particular condition of the communication channel over which the data has been received. In particular, CSI values are derived from pilot symbols that are received over the channel, which pilot symbols are known by the receiver. In this manner, the receiver is able to determine the condition of the communication channel (i.e., fade conditions, signal strength, noise levels, phase coherency). The CSI value is calculated and used as a threshold for deciding which of the four possible symbols (i.e., +3, +1, −1, −3) may have been received. In a preferred embodiment, CSI is calculated as follows:

$$CSI = |P_r|^2/2 \tag{1}$$

where $|P_r|^2$ is the squared magnitude of the received complex pilot symbol.

CSI values and received data symbols are used by the Viterbi decoder to decode the data symbols that were trellis encoded at the transmitter end. As an example, for each one-quarter rate trellis encoded symbol (or pair of one-half rate trellis encoded symbols), 16 decision metrics are calculated as follows:

$$\text{Decision Metric} = (Y^2 \cdot CSI) - (4Y \cdot S) \tag{2}$$

where Y is one of the four possible data symbols; and $$S = (XP_r^* P_t)/4 \tag{3}$$

where

X is the received data symbol;

$P_r^*$ is the complex conjugate of the received complex pilot symbol; and $P_t$ is the transmitted complex pilot symbol (a predetermined value known at the receiver).

The Viterbi decoder algorithm uses the decision metric values to calculate a measure of similarity between the received encoded symbol and eight possible encoding states. This measure of similarity is used to decode the trellis encoded symbols that are received.

After calculating the CSI values, a decision is reached (407) to determine whether or not the steal flag bit has been set. If the steal flag bit is set (i.e., some of the received symbols have been overwritten, or compromised) the added control information is extracted, and the symbol metric is reset (411) to a very low value, which value is then substituted for the calculated metric. This forces the Viterbi decoder algorithm to rely on the metrics for the encoded symbols from the adjacent data symbols (i.e., uncompromised data symbols positioned before and after the compromised symbol), rather than on those for the data symbol that has been compromised. The data symbols are then optionally de-interleaved (408)—i.e., if interleaved at the transmitter—and Viterbi decoded (409) using either the calculated or the reset metric. [It should be noted that it is only important that the compromised symbols are not adjacent to each other just prior to decoding. That is, if a contiguous portion of the transmitted information has been compromised, the compromised symbols should be separated (e.g., de-interleaved) at the receiver. Alternatively, the transmitter might compromise (i.e., overwrite control information onto the encoded data stream) non-contiguous symbol positions, whereby the receiver need not necessarily separate the compromised symbols before decoding.] The resulting bits are then VSELP decompressed (413) into digital bits of information, which bits represent the transmitted voice.

In this manner, the digital radio communication system is able make use of the added bandwidth that is effectively provided for control information that is occasionally required. This advantage is provided without undesired degradation of the signal quality, due to the intelligence built into the receiver. Accordingly, the present invention makes use of well known encoding and decoding techniques, together with a simple decision metric calculation to provide a robust, spectrally efficient digital radio communication system.

What is claimed is:

1. In a radio communication system, a method of facilitating transmission of control information without an accompanying degradation in voice signal quality, comprising the steps of:

at a transmitter;

over-writing the control information onto a first predetermined portion of a plurality of discrete data elements to produce compromised discrete data elements;

indicating, using a second predetermined portion of the plurality of discrete data elements, that the first predetermined portion has been over-written;

encoding at least the first and second portions and transmitting them over a communication channel to produce a plurality of encoded discrete data elements; and at a receiver;

receiving, via the communication channel, the plurality of encoded discrete data elements;

when it is indicated that the first portion has been over-written, providing a decision metric; and decoding the first portion using at least the decision metric.

2. The method of claim 1, further comprising the step of:

prior to the step of decoding, altering the first portion, such that at least some of the over-written encoded discrete data elements are not adjacent to each other.

3. The method of claim 2, further comprising the step of, at the transmitter, interleaving elements of the first predetermined portion to produce interleaved elements, and wherein the step of altering comprises the step of:

de-interleaving the interleaved elements of the first portion.

4. The method of claim 1, further comprising the step of:

at the receiver;

after the step of receiving, evaluating the second predetermined portion of the transmission stream; and wherein the step of providing comprises the step of:

setting, responsive to the step of evaluating, the decision metric to a value within a predetermined range of values.

5. In a radio communication system, a method of facilitating transmission of control information without an accompanying degradation in voice signal quality, comprising the steps of:

at a transmitter;

over-writing the control information onto a first predetermined portion of a plurality of discrete data elements to produce compromised discrete data elements;

indicating, using a second predetermined portion of plurality of discrete data elements, that the first predetermined portion has been over-written;

encoding at least the first and second portions and transmitting them over a communication channel to produce a plurality of encoded discrete data elements; and at a receiver;

receiving, via the communication channel, the plurality of encoded discrete data elements;

determining channel state information for the communication channel;

using at least the channel state information to calculate a decision metric; and when it is indicated that the first portion has been over-written, using at least the decision metric to decode the first portion.

6. The method of claim 5, further comprising the step of:

at the receiver;

prior to the step of using at least the decision metric, altering the first portion, such that at least some of the over-written encoded discrete data elements are not adjacent to each other.

7. The method of claim 6, further comprising the step of, at the transmitter, interleaving elements of the first predetermined portion to produce interleaved elements, and wherein the step of altering comprises the step of:

de-interleaving the interleaved elements of the first portion.

* * * * *